(12) United States Patent
Kondo et al.

(10) Patent No.: US 6,369,673 B1
(45) Date of Patent: Apr. 9, 2002

(54) SURFACE ACOUSTIC WAVE FILTER WITH TERMINAL ELECTRODE COATING FILM

(75) Inventors: Chikashi Kondo, Kanazawa; Seigo Hayashi, Komatsu; Haruo Morii, Kanazawa, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/536,967

(22) Filed: Mar. 28, 2000

(30) Foreign Application Priority Data

Apr. 9, 1999 (JP) .......................................... 11-101945

(51) Int. Cl.[7] .............................................. H03H 9/64
(52) U.S. Cl. .................................... 333/193; 310/313 B
(58) Field of Search ............................... 333/194, 193; 310/313 R, 313 B

(56) References Cited

U.S. PATENT DOCUMENTS 4,291,285 A * 9/1981 Kadota ....................... 333/150
5,821,665 A * 10/1998 Onishi et al. ............. 310/313 R
6,078,123 A * 6/2000 Tanaka et al. ............ 310/313 R
6,078,229 A * 6/2000 Funada et al. ................ 333/193

FOREIGN PATENT DOCUMENTS

| JP | 3-32211 A | * | 6/1989 | ............ H03H/9/25 |
| JP | 3-49308 | | 3/1991 | |
| JP | 10-163800 A | * | 6/1998 | ............ H03H/9/25 |
| JP | 10-178330 | | 6/1998 | |
| JP | 11-41054 A | * | 2/1999 | .......... H03H/9/145 |

* cited by examiner

*Primary Examiner*—Justin P. Bettendorf
*Assistant Examiner*—Dean Takaoka
(74) *Attorney, Agent, or Firm*—Keating & Bennett, LLP

(57) ABSTRACT

A surface acoustic wave filter includes a glass substrate, an interdigital transducer provided on the glass substrate, a piezoelectric film arranged on the glass substrate so as to cover the interdigital transducer; a terminal electrode provided on the glass substrate and electrically connected to the interdigital transducer; and a coating film having an area smaller than that of the terminal electrode. The coating film is arranged on the terminal electrode such that a portion of a top surface of the terminal electrode is exposed throughout the periphery thereof.

20 Claims, 3 Drawing Sheets

SURFACE ACOUSTIC WAVE FILTER WITH TERMINAL ELECTRODE COATING FILM

BACKGROUND OF THE INVENTION

1. Field of the Invention

The present invention relates to a surface acoustic wave filter, and more particularly, to a surface acoustic wave filter including a glass substrate.

2. Description of the Related Art

Surface acoustic wave filters (SAW filters) have been widely used in various frequency ranges to define a band-pass filter or other such components. Such surface acoustic wave filters generally have a structure in which an interdigital transducer is disposed on a piezoelectric substrate. A surface acoustic wave filter in which an interdigital transducer is disposed between a piezoelectric film and a glass substrate is also known and is disclosed in, for example, Japanese Unexamined Patent Publication Nos. 3-49308 & 10-178330.

The conventional surface acoustic wave filters having an interdigital transducer disposed on a glass substrate often suffer the problem that the glass substrate cracks when lead terminals are soldered to terminal electrodes of the interdigital transducers.

SUMMARY OF THE INVENTION

In order to solve the problems described above, preferred embodiments of the present invention provide a surface acoustic wave filter which prevents the glass substrate from cracking when lead terminals are soldered to terminal electrodes of interdigital transducers.

According to one preferred embodiment of the present invention, a surface acoustic wave filter includes a glass substrate, an interdigital transducer provided on the glass substrate, a piezoelectric film arranged on the glass substrate so as to cover the interdigital transducer, a terminal electrode provided on the glass substrate and electrically connected to the interdigital transducer, and a coating film having an area smaller than that of the terminal electrode, the coating film being arranged on the terminal electrode such that a portion of a top surface of the terminal electrode is exposed throughout the periphery thereof.

It is preferable that the coating film has a better wettability with solder than the terminal electrode. For example, the terminal electrode preferably includes aluminum and the coating film preferably includes at least one of nickel and silver.

It is also preferable that an edge of the coating film is recessed from an edge of the terminal electrodes by about 10 µm.

According to the surface acoustic wave filter of preferred embodiments of the present invention, the coating film does not directly contact the glass. Consequently, the stress caused by contraction of the solder acting on the coating film is absorbed by the terminal electrode to prevent the stress from directly acting on the glass substrate, thereby preventing cracks from being generated in the glass substrate.

The contraction stress acting on the glass substrate is reduced to about one-half of the contraction stress acting on the conventional glass substrate, when the periphery of the terminal electrode protrudes to the exterior by an amount that is about 10 µm or more than the periphery of the coating film.

Other features, advantages, characteristics and elements of the present invention will become apparent from the detailed description of preferred embodiments below with reference to the attached drawings.

For the purpose of illustrating the invention, there is shown in the drawings several forms which are presently preferred, it being understood, however, that the invention is not limited to the precise arrangements and instrumentalities shown

DETAILED DESCRIPTION OF PREFERRED EMBODIMENTS

Figure 1:
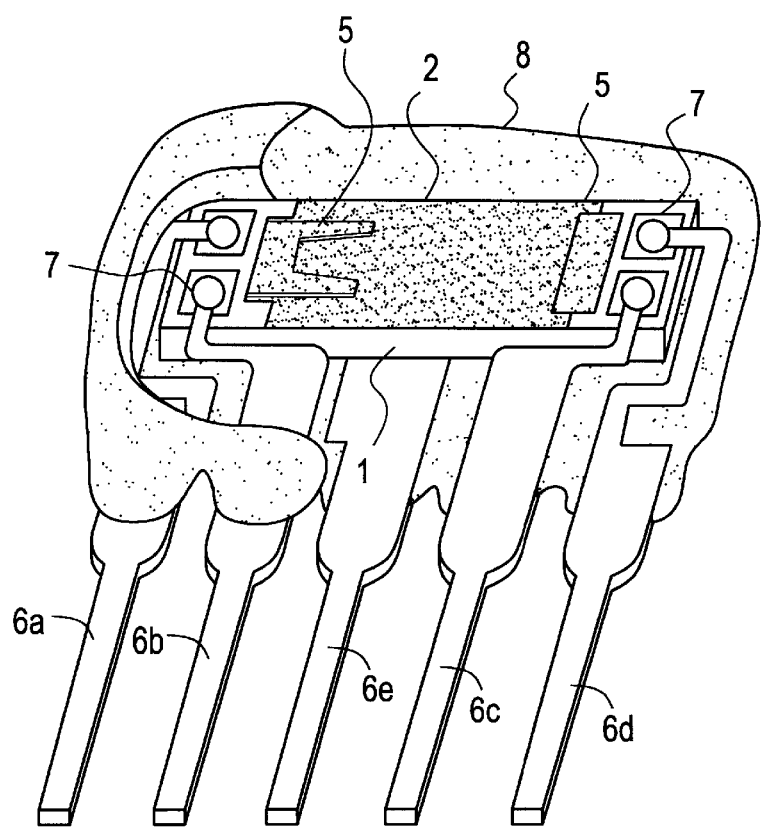
FIG. 1 is a perspective view of the a surface acoustic wave filter according to a preferred embodiment of the present invention.
Figure 2:
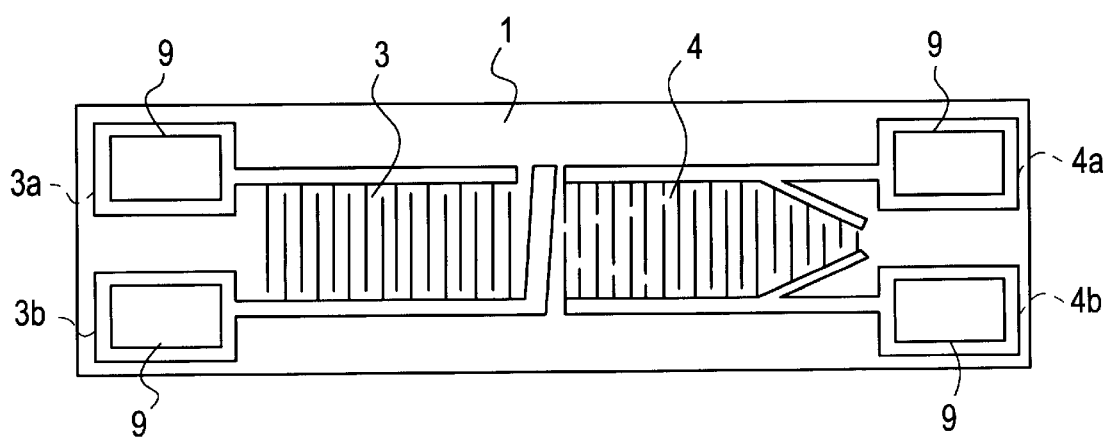
FIG. 2 is a plan view of a glass substrate having an electrode pattern thereon for use in the surface acoustic wave filter shown in FIG. 1.
Figure 3:
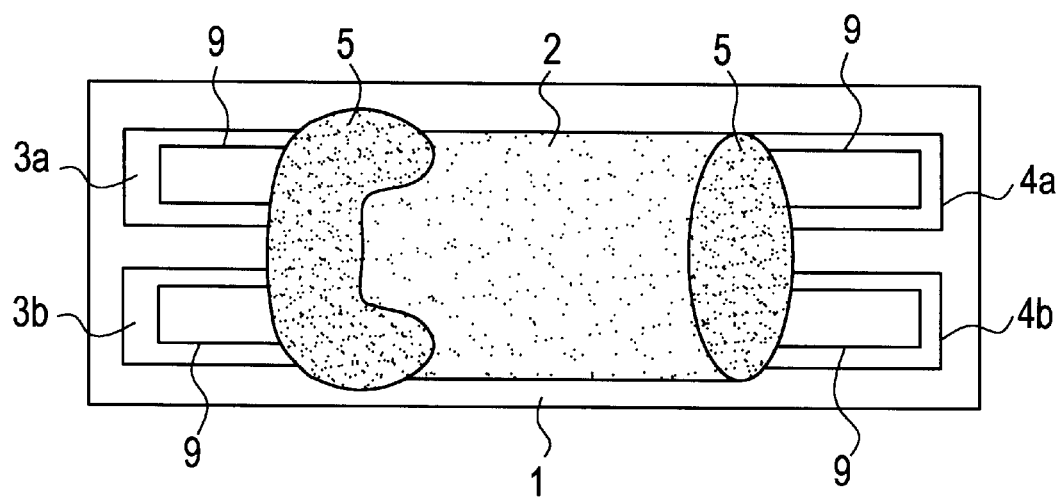
FIG. 3 is a plan view of a glass substrate having an electrode pattern, a piezoelectric film and a damping agent thereon for use in the surface acoustic wave filter shown in FIG. 1.
Figure 4:
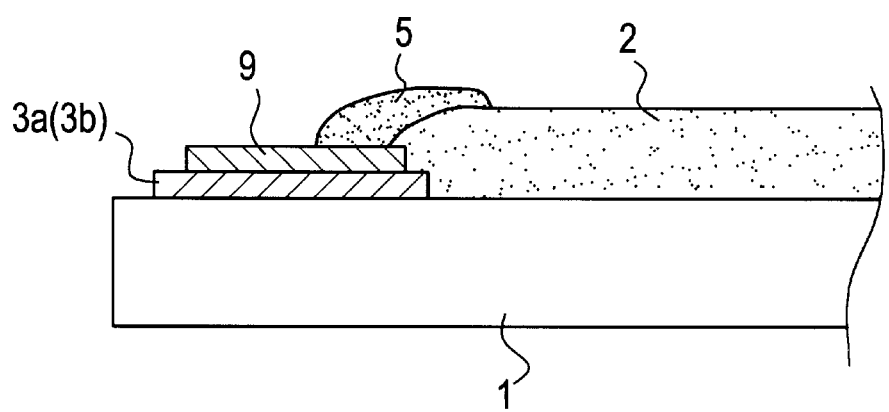
FIG. 4 is a partially enlarged side view of the surface acoustic wave filter shown in FIG. 1.

As a result of intensive study of the cracking failure of glass substrates included in surface acoustic wave filters, the inventors of the present invention discovered that the cracking failure of the glass substrate is caused by the contraction of solder during the soldering of lead terminals. The inventors, therefore, invented the surface acoustic wave filter having the unique structure described below.

Hereinafter, preferred embodiments of the present invention are explained in detail with reference to the drawings.

Referring to FIGS. 1 to 4, a glass substrate 1 has a piezoelectric film 2, such as a ZnO film, provided thereon, and input/output electrodes 3 and 4 defined by IDT electrodes (see FIG. 2) disposed between the glass substrate 1 and the piezoelectric film 2. A damping agent 5 for absorbing extraneous waves is preferably coated on both ends of the piezoelectric film 2.

The terminal electrodes (the lowermost layer) 3a and 3b and the terminal electrodes 4a and 4b (the lowermost layer) are used for soldering lead terminals 6a to 6d, and are integrated with input-output electrodes 3 and 4 defined by the IDT electrodes, respectively. The IDT electrodes are preferably formed by a thin film deposition method such as sputtering or vapor deposition. The terminal electrodes 3a and 3b, and 4a and 4b, extend up to both side edges of the glass substrate 1 along the longitudinal direction, and are exposed outside of a piezoelectric film 2. A coating film (the uppermost layer) 9 preferably including a metal having a good wettability with the solder is provided on the terminal electrodes 3a and 3b, and 4a and 4b preferably via plating. The coating film 9 is arranged to occupy a smaller area than the area of the terminal electrodes 3a and 3b, and 4a and 4b. Solders 7 are attached on lead terminals 6a to 6d, and the periphery of the surface acoustic wave filter is preferably covered with a protective resin 8.

Figure 5:
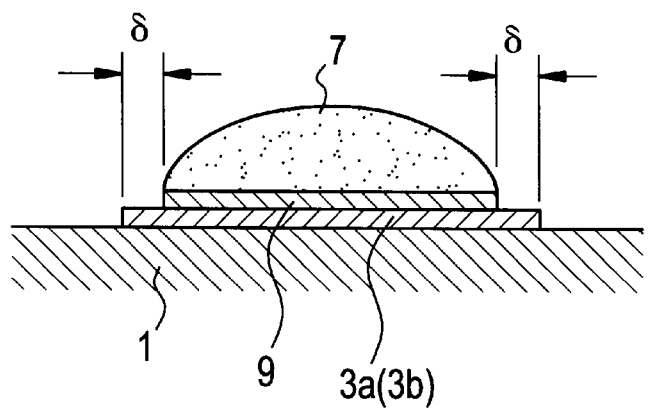
FIG. 5 is an enlarged cross-sectional view of the terminal electrodes according to preferred embodiments of the present invention.

FIG. 5 shows the structure of the terminal electrodes according to a preferred embodiment of the present invention.

As shown in the drawing, multiple layers of the terminal electrodes 3a and 3b, and 4a and 4b, and the coating film 9 are provided on the glass substrate 1, and the solder 7 is attached on the coating film 9. The coating film 9 is arranged to occupy a smaller area than the areas of the terminal electrodes 3a and 3b, and 4a and 4b so that portions of top surfaces of the terminal electrodes 3a and 3b, and 4a and 4b are exposed throughout the periphery thereof. As a result, the edge of the coating film 9 is recessed from the edges of the terminal electrodes 3a and 3b, and 4a and 4b by a gap The terminal electrodes 3a and 3b, and 4a and 4b, are preferably formed, for example, using aluminum having a thickness of about 0.5 μm, and the coating film 9 is formed for example, using Ni/Ag having a thickness of about 1 μm. It is preferable that the coating film 9 has better wettability with solder than that of terminal electrodes 3a and 3b, and 4a and 4b. The gap 8 is preferably about 10 μm. A glass plate with a thickness of about 1 mm was used as the glass substrate 1 in one example of preferred embodiments of the present invention.

While a stress caused by contraction of the solder due to temperature difference is generated when the solder 7 is cooled from its liquid phase temperature to room temperature, the contraction stress of the solder acting on the coating film 9 is absorbed by the terminal electrodes 3a and 3b, and 4a and 4b, since the terminal electrodes 3a and 3b, and 4a and 4b, have a larger area than the area of the coating film 9. As a result, the stress is prevented from directly acting on the glass substrate 1. Therefore, the glass substrate 1 is protected and cracks are prevented from occurring in the substrate 1.

Figure 6:
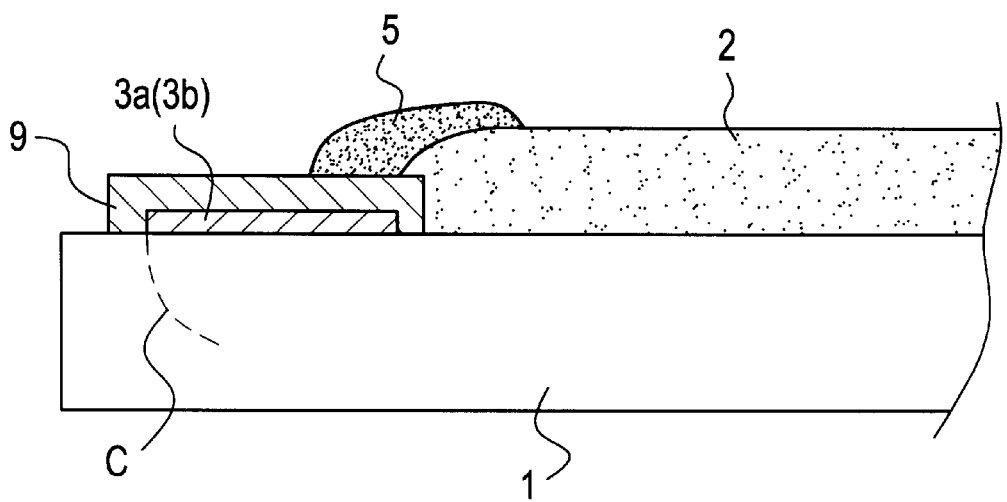
FIG. 6 is an enlarged cross sectional view of the terminal electrodes according to a comparative example.

On the contrary, in the case of the comparative example shown in FIG. 6, a coating film 9 is directly in contact with glass substrate 1. In this case, the stress of the solder acting on the coating film 9 is applied to the glass substrate at the edge of the coating film 9 as indicated by dotted line C.

An FEM analysis revealed that the contraction stress acting on the glass substrate 1 is reduced to one-half of the stress acting on the conventional substrate, by forming a gap 8 preferably having a width of about 10 μm or more.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave filter comprising:
   a glass substrate;
   an interdigital transducer provided on the glass substrate;
   a piezoelectric film arranged on the glass substrate so as to cover the interdigital transducer;
   a terminal electrode provided on the glass substrate and electrically connected to the interdigital transducer; and
   a coating film having an area smaller than that of the terminal electrode, the coating film being provided on the terminal electrode such that a portion of a top surface of the terminal electrode is exposed throughout the periphery thereof.

2. The surface acoustic wave filter according to claim 1, wherein the coating film has a better wettability with solder than the terminal electrode.

3. The surface acoustic wave filter according to claim 2, wherein the terminal electrode comprises aluminum.

4. The surface acoustic wave filter according to claim 3, wherein the coating film comprises at least one of nickel and silver.

5. The surface acoustic wave filter according to claim 1, wherein an edge of the coating film is recessed from an edge of the terminal electrodes by about 10 μm.

6. The surface acoustic wave filter according to claim 1, further comprising a lead terminal, wherein the lead terminal is soldered to the coating film.

7. The surface acoustic wave filter according to claim 1, wherein the piezoelectric film comprises a ZnO film.

8. The surface acoustic wave filter according to claim 1, further comprising input/output electrodes defined by interdigital electrodes disposed between the glass substrate and the piezoelectric film.

9. The surface acoustic wave filter according to claim 1, further comprising a damping agent arranged to absorb extraneous surface acoustic waves.

10. The surface acoustic wave filter according to claim 9, wherein the damping agent is disposed at both ends of the piezoelectric film.

11. The surface acoustic wave filter according to claim 1, further comprising a plurality of the terminal electrodes which are arranged to extend up to both side edges of the glass substrate along the longitudinal direction and are exposed outside of the piezoelectric film.

12. The surface acoustic wave filter according to claim 1, wherein the coating film includes metal.

13. The surface acoustic wave filter according to claim 1, further comprising lead terminals and solder members connected to the lead terminals.

14. The surface acoustic wave filter according to claim 1, further comprising a protective resin arranged to surround and cover the periphery of the surface acoustic wave filter.

15. The surface acoustic wave filter according to claim 1, further comprising a plurality of the terminal electrodes provided on the glass substrate.

16. The surface acoustic wave filter according to claim 1, further comprising a plurality of solder members connected to the coating film.

17. The surface acoustic wave filter according to claim 1, further comprising a plurality of terminal electrodes each comprising aluminum sheets having a thickness of about 0.5 μm.

18. The surface acoustic wave filter according to claim 1, wherein the coating film 9 includes Ni/Ag having a thickness of about 1 μm.

19. The surface acoustic wave filter according to claim 1, wherein the glass substrate includes a glass plate having a thickness of about 1 mm.

20. The surface acoustic wave filter according to claim 1, wherein the coating film is arranged to prevent stress from acting directly on the glass substrate.

* * * * *